(12) United States Patent
Peng et al.

(10) Patent No.: US 10,504,425 B2
(45) Date of Patent: Dec. 10, 2019

(54) OLED LIGHT SOURCE, DISPLAY DEVICE AND METHOD FOR FABRICATING THE SAME

(71) Applicant: BOE TECHNOLOGY GROUP CO., LTD., Beijing (CN)

(72) Inventors: Kuanjun Peng, Beijing (CN); Xiangxiang Zou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/997,940

(22) Filed: Jun. 5, 2018

(65) Prior Publication Data

US 2019/0088197 A1   Mar. 21, 2019

(30) Foreign Application Priority Data

Sep. 15, 2017   (CN) .......................... 2017 1 0834149

(51) Int. Cl.
*G09G 3/30* (2006.01)
*G09G 3/3225* (2016.01)
(Continued)

(52) U.S. Cl.
CPC ....... *G09G 3/3225* (2013.01); *H01L 27/3234* (2013.01); *H01L 27/3246* (2013.01); *H01L 27/3276* (2013.01); *H01L 51/5206* (2013.01); *H01L 51/5221* (2013.01); *H01L 51/56* (2013.01); *H01L 2251/5361* (2013.01)

(58) Field of Classification Search
CPC ..... G09G 3/3208–3291; G09G 3/3622; G09G 3/12; G09G 3/14; G09G 3/30–3291; G09G 2360/14–148; G09G 2300/06
See application file for complete search history.

(56) References Cited

U.S. PATENT DOCUMENTS

2011/0221720 A1*  9/2011  Kuo ................... H01L 27/3269
                                                                          345/206
2013/0032792 A1    2/2013  Huang et al.
(Continued)

FOREIGN PATENT DOCUMENTS

| CN | 102881697 A | 1/2013 |
|---|---|---|
| CN | 104867948 A | 8/2015 |
| CN | 107093619 A | 8/2017 |

OTHER PUBLICATIONS

First Office Action for Chinese Patent Application No. 201710834149.3 dated Aug. 2, 2019.

*Primary Examiner* — Sanghyuk Park
(74) *Attorney, Agent, or Firm* — Calfee, Halter & Griswold LLP (57) ABSTRACT

The present disclosure provides an OLED light source, a display device and a method for fabricating the same. The OLED light source includes: light emitting units including anodes arranged in an array; metal wires for connecting the anodes, which are disposed between the light emitting units; an photosensitive sensor disposed on the metal wires, the metal wires being as a sense electrode of the photosensitive sensor; a drive electrode provided on the photosensitive sensor; and an opening disposed at a position where the metal wires correspond to the drive electrode, wherein the photosensitive sensor receives an external light signal through the opening.

17 Claims, 5 Drawing Sheets

(51) Int. Cl.
*H01L 51/52* (2006.01)
*H01L 27/32* (2006.01)
*H01L 51/56* (2006.01)

(56) References Cited

U.S. PATENT DOCUMENTS

2016/0240133 A1* 8/2016 Gelinck .................. G09G 3/02
2016/0321987 A1* 11/2016 Oh ....................... G09G 3/3648

* cited by examiner

OLED LIGHT SOURCE, DISPLAY DEVICE AND METHOD FOR FABRICATING THE SAME

CROSS REFERENCE

The present application claims the priority of Chinese Patent Application No. 201710834149.3, filed on Sep. 15, 2017, and the entire contents thereof are incorporated herein by reference as part of the present application.

TECHNICAL FIELD

The present disclosure relates to the technical field of OLED, in particular, to an OLED light source, a display device and a method for fabricating the same.

BACKGROUND

Organic Light Emitting Diode (OLED) devices have characteristics such as self-luminescence, high brightness, wide-viewing angle, high contrast, flexibility, low power consumption and the like, thus attract widespread attention and, as new generations of light emitting units or display devices, are widely used in light sources, mobile phone screens, computer monitors, full-color television and other fields. At the same time, with the continuous improvement of people's living standards, higher requirements have been put forward for the corresponding equipment intelligence and comfort. For example, many devices are now controlled by the original manual manner, remote control or the latest remote sensing motion recognition. However, prior to achieve non-contact remote sensing control, it is firstly need that the device has a light sensing function.

SUMMARY

The present disclosure provides an OLED light source. The OLED light source includes:
light emitting units including anodes arranged in an array;
metal wires for connecting the anodes, which are disposed between the light emitting units;
a photosensitive sensor disposed on the metal wires, the metal wires being as a sense electrode of the photosensitive sensor;
a drive electrode corresponding to the top of the metal wires and formed on the photosensitive sensor; and
an opening disposed at a position where the metal wires correspond to the drive electrode.

The photosensitive sensor is configured to receive an external light signal through the opening.

The present disclosure provides a display device including any one of the above described OLED light sources.

The present disclosure provides a method for fabricating an OLED light source. The method includes:
forming light emitting units which include anodes arranged in an array;
forming metal wires for connecting the anodes, which are disposed between the light emitting units;
forming a photosensitive sensor disposed on the metal wires, the metal wires being as a sense electrode of the photosensitive sensor;
forming a drive electrode provided on the photosensitive sensor; and
forming an opening disposed at a position where the metal wires correspond to the drive electrode,
wherein the photosensitive sensor is configured to receive an external light signal through the opening.

In some exemplary embodiments, the methods further comprising:
forming metal wires with a grid-like structure on a substrate and disposing an opening at a predetermined position of the metal wires;
forming a passivation layer on the metal wires;
forming an active layer of a photosensitive sensor on the passivation layer;
forming an anode layer pattern and a drive electrode on the active layer of the photosensitive sensor and the anode layer is connected to the metal wires through a via, the drive electrode being above an opening of the metal wires;
forming a pixel definition layer above the anode layer and the drive electrode;
forming an electroluminescent layer and a cathode layer on the pixel definition layer; and
forming a packaging layer on the cathode layer.

DETAILED DESCRIPTION

To make the objectives, technical solutions, and advantages of the present disclosure clearer, the present disclosure will be further described in detail with reference to specific embodiments the accompanying drawings.

It should be noted that all the expressions "first" and "second" in the embodiments of the present disclosure are used for distinguishing between two entities or elements with the same name that are not the same, and for ease of description only. These expressions should not be deemed as a limitation on the embodiments of the present disclosure, and the subsequent embodiments will not be described one by one.

However, in common OLED light sources or corresponding devices, remote sensing control or light sensing function are generally realized through external infrared devices, and this not only makes the device be separate and not easy to carry or placement, but also may inhibit signal transmission and compatibility, thus resulting in poor control.

Therefore, in the process for implementing the present disclosure, the inventor finds that at least the following problems may exist in the prior art: when the current OLED light source or corresponding device realizes the light sensing function, an external photosensitive sensor is required, and this not only increases the difficulty and cost of the process, but also has poor control effect and accuracy.

Figure 1:
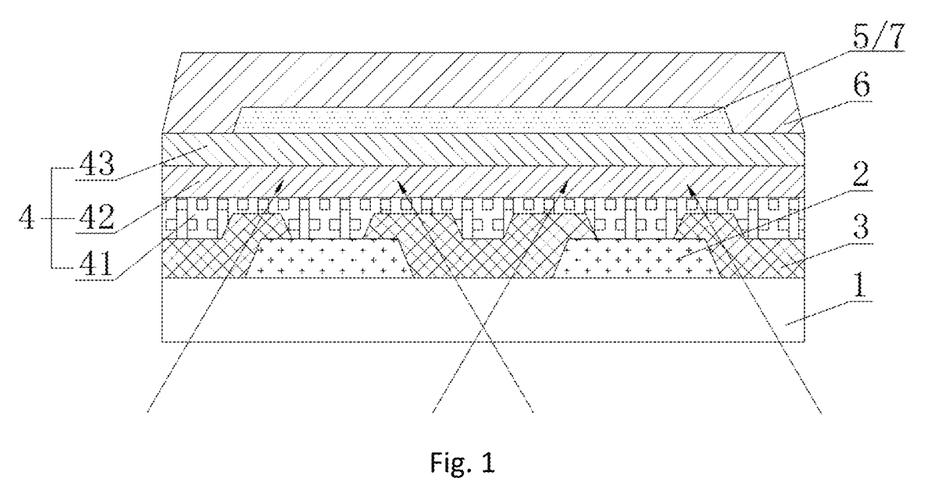
FIG. 1 is a schematic diagram illustrating a structure of an embodiment of an OLED light source according to the present disclosure.

Referring to FIG. 1, it is a schematic diagram illustrating a structure of an embodiment of an OLED light source according to the present disclosure. The OLED light source includes: light emitting units (for example, lamp beads) including anodes 5 arranged in an array; metal wires 2 for connecting the anodes 5, which are disposed between the light emitting units and on the substrate 1; a layer of photosensitive sensor 4 (i.e., the PIN three-layer active layer structure (41, 42, 43) described in the figure) disposed on the metal wires 2, the metal wires 2 being as a sense electrode (Rx) of the photosensitive sensor; a drive electrode 7 (Tx) provided on the photosensitive sensor; and an opening disposed at a position where the metal wires 2 correspond to the drive electrode 7. The photosensitive sensor 4 is configured to receive an external light signal through the opening. Since the anodes 5 are connected with the metal wires 2 through a via and the drive electrode 7 is further disposed on the metal wires 2, the drive electrode 7 and the anodes 5 are partially overlapped in FIG. 1. However, as can be seen from FIG. 3, the drive electrode 7 and the via of the anode 5 are spaced from each other. Therefore, the OLED light source of the present disclosure is characterized in that a photosensitive sensor unit is added in the structure of the relevant OLED light source, so as to enable the OLED light source to have a light sensing function. That is to say, it can realize more remote sensing control operations by sensing light. For example, a corresponding control identification circuit is added and based on the OLED light source, the user can realize the remote sensing control of the light source through gesture actions. Due to the fact that the OLED light source described herein is fully compatible with the related OLED Lighting structure, in case of increasing minimal cost, the integration of the photosensitive sensor is realized. In addition, since the photosensitive sensor of the present disclosure disposed on the metal wires, the light sensing function may not occupy the corresponding open area for the OLED light source to emitting light.

It needs to be noted that the light source in the embodiments of the present disclosure is not limited to a light emitting device, and it can also be interpreted as a display device.

It can be known from the above embodiments that an active layer of the photosensitive sensor is fabricated on the corresponding metal wires of the OLED light source such that the metal wires in the OLED are used as a sense electrode of the photosensitive sensor, and a drive electrode is fabricated on the active layer. This allows the metal wires, the active layer and the drive electrode to form a complete photosensitive sensor. At the same time, an opening disposed on the metal wires such that an optical signal from the outside of the light source can enter into the photosensitive sensor through the opening. In this way, the photosensitive sensor can also sense the change of the external light signal, and further can implement the subsequent gesture operation or remote sensing control function. As the solution of the present disclosure merely adds an active layer on the metal wires, the manufacture process of the OLED light source is simple and can fully utilize existing processes or equipment, especially, existing metal wires can be used and the drive electrodes can be used as two sense electrodes for the photosensitive sensor, which can greatly reduce the cost. At the same time, since the photosensitive sensor is located in the metal wires corresponding to the entire light source, more photosensitive sensors can be provided, so that the OLED light source has more accurate photosensitivity, and then, identification accuracy and corresponding control effect can be improved. Thus, the OLED light source according to the present disclosure may be fabricated by a simple related process while improving the light sensing function, thereby reducing the cost and improving the corresponding control effect and control accuracy.

Figure 3:
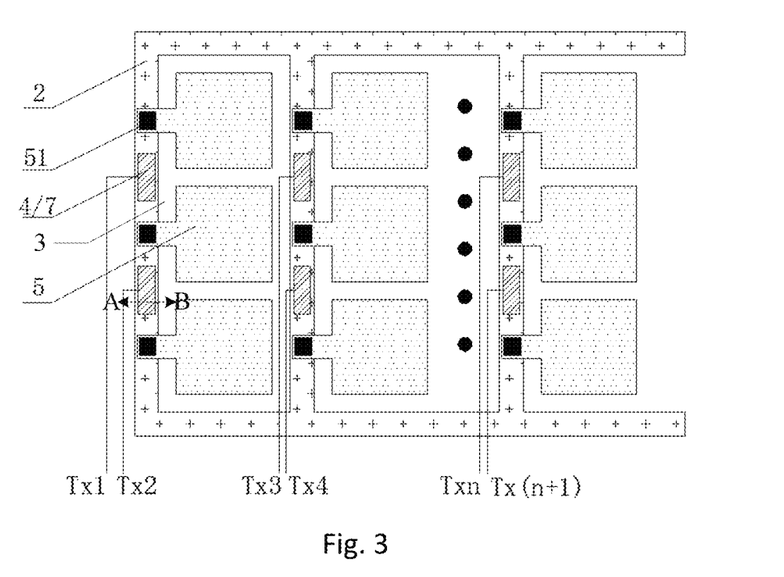
FIG. 3 is a schematic diagram illustrating a structure of an OLED light source with a photosensitive sensor according to an embodiment of the present disclosure.

In some exemplary embodiments of the present disclosure, along the A-B section line shown in FIG. 3 getting the last diagram of FIG. 6, and referring to FIG. 6, the photosensitive sensor 4 in the OLED light source is located below the drive electrode 7, and the electroluminescent layer 8 is located above the anode 5. This can make the detection of the photosensitive sensor 4 and the light emitting structure of the OLED light source or the corresponding control circuit are independent. In this way, not only the existing metal wires can be shared by the photosensitive sensors, but also the realization of the light emitting function of the original OLED light source is not affected at all.

Further, the drive electrode and the anode are located in the same layer and spaced from each other. In some exemplary embodiments of the present disclosure, the driving electrode and the anode are made of same material.

In some exemplary embodiments of the present disclosure, the driving electrode and the anode are simultaneously formed by a single patterning process. In this way, during the fabrication of the entire OLED light source, there is no need to add too many additional process flows, and only the active layer of the photosensitive sensor needs to be formed on the metal layer accordingly, and the rest of the process is exactly the same as the original process. At the same time, since the drive electrode and the anode are formed at the same time through a single patterning process, it is possible to ensure that the drive electrode and the anode are accurately separated from each other and the short-circuiting issue cannot be caused by difference between the former process and the later process. Therefore, the above design can further improve the product's yield rate.

Figure 2:
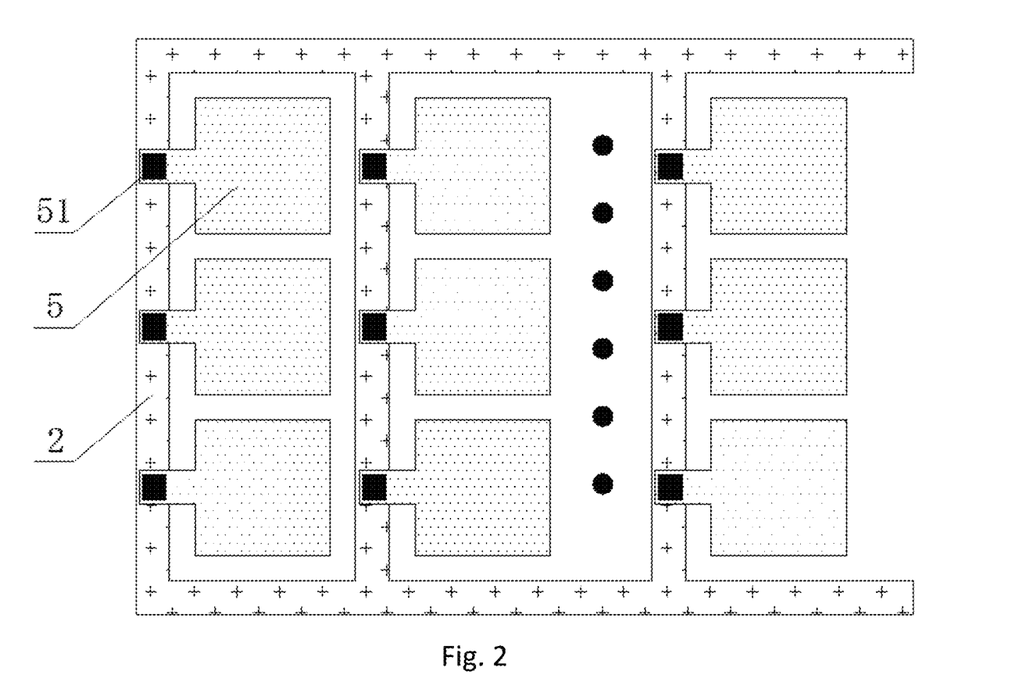
FIG. 2 is a schematic diagram illustrating a layout of metal wires in an OLED light source according to an embodiment of the present disclosure.

Referring to FIG. 2, it is a schematic diagram illustrating a layout of metal wires in an OLED light source according to an embodiment of the present disclosure; FIG. 3 is a schematic diagram illustrating a structure of an OLED light source with a photosensitive sensor according to an embodiment of the present disclosure. As can be seen from the figure, the metal wires 2 are provided on the substrate and have a grid-like structure, which not only can reduce the anode resistance, but also can reduce the adverse phenomena caused by the short circuit between the anode 5 and the cathode. As can be seen from FIG. 3, the active layer 4 and the drive electrode 7 of the photosensitive sensor completely disposed in the idle position of the metal wires and are offset from the position of the anode via 51, so as not to have a large influence on the rest of the structure. The photosensitive sensor can thus be stably and effectively integrated into the OLED light source structure.

In some exemplary embodiments of the present disclosure, a plurality of photosensitive sensors will be disposed in one OLED light source, and therefore, each photosensitive sensor needs to be connected to the corresponding control or detect circuit through the lead wire (Tx1 ... Tx(n+1)). In this way, each sensor is a separate unit, and even if one or several sensors are damaged, the overall light sensing function will not be affected. Of course, it is also possible to achieve joint light sensing function by controlling a plurality of sensors, which can further improve the photosensitivity, thereby improving the accuracy and reliability of subsequent remote sensing control or gesture recognition.

In some exemplary embodiments of the present disclosure, the openings on the metal wires are correspondingly arranged according to the positions and distances of the metal wires. For example, in a dense area for metal wires, the spacing between openings may be larger, and in a sparse area for metal wires or sensors, the openings may be denser, which may enable the entire OLED identification area to be more uniform, and improve the accuracy and stability of recognition.

In some exemplary embodiments of the present disclosure, the photosensitive sensor has a PIN structure and the PIN structure comprises semiconductor materials as an active layer. In some exemplary embodiments of the present disclosure, the semiconductor material adopted by the PIN structure is: p-a-Si:H, i-a-Si:H and n-a-Si:H; or p-ZnO, i-ZnO and n-ZnO; or p-IGZO, i-IGZO and n-IGZO; or p-GaN, i-GaN and n-GaN; or, each of the PIN three layers adopts composite doping material corresponding to the above materials.

The operating principle of the OLED light source according to the present disclosure is as follows. For a photosensitive sensor, the metal wires are maintained at a ratifying positive voltage, and are used as sense electrodes (Rx); pa-Si:H, i-a-Si:H, n-a-Si:H is used as an active layer. After being irradiated by the light passing through the openings, photo-generated carriers can be generated. The anode is a current detection electrode, that is, a drive electrode, and the drive electrodes of different sensors are respectively extracted to form a detection terminal for realization of the full detection of the OLED light source.

Specifically, in the OLED light source, Metal is a metal wire with a certain width; the light emitting area is defined by a pixel definition layer (PDL), and the electroluminescent (EL) material may be in contact with the anode to emit light when the PDL is hollowed out. Metal layer is covered by the PDL, the EL material in this area does not emit light. The core concept of the present disclosure is that a PIN layer is formed on the Metal wires to fabricate a photosensitive sensor, which is fully compatible with the manufacturing process of the related OLED light source. Therefore, the PDL definition area and the EL light emitting section are the same as those of the OLED light source in the prior art. In addition, the added photosensitive sensor does not affect the aperture ratio for the OLED light source to emit light. The Metal wires have a certain width. The design for hollowing the Metal wires allows external light to enter the PIN layer and sense external light signals. Since all of PIN structures are located on the Metal wires, there will be no effect on the OLED light source. In other words, the EL light emitting area and the Sensor area do not interfere with each other, thus the operation of the sensor area does not affect the EL area to emit light. More specifically, the brightness for EL to emit light depends on the voltage difference between the anode and the cathode. The anode is connected to the Metal wires through the via. The voltage of the anode is generally 4V-7V; the voltage of the cathode is −3V-0V. For the Sensor area, the PIN layer is its active layer and is used to generate photo-generated carriers. The photo-generated carriers are converted into current by the traction between the upper and lower electrodes of the PIN layer (i.e., the voltage difference between the metal track and the drive electrode). The change of current represents the change of the external ambient light. In the embodiment of the present disclosure, the lower electrode of the PIN layer is a Metal layer, and its upper electrode is a drive electrode. It should be specially stated that the drive electrode of the Sensor section and the anode of the EL section are separated. Therefore, the drive electrode of the Sensor section can apply the corresponding pulse signal according to the needs of the Sensor, so as to sense the change of the photo-generated current.

In some exemplary embodiments, the present disclosure also discloses a display device including the above described OLED light source. For example, the OLED light source can be used as a display device capable of displaying numerical values from 0 to 9, and this display device can adjust the displayed numerical value by sensing the change of the external light signal. For example, the displayed numerical value can represent the change of light intensity and so on.

Figure 4:
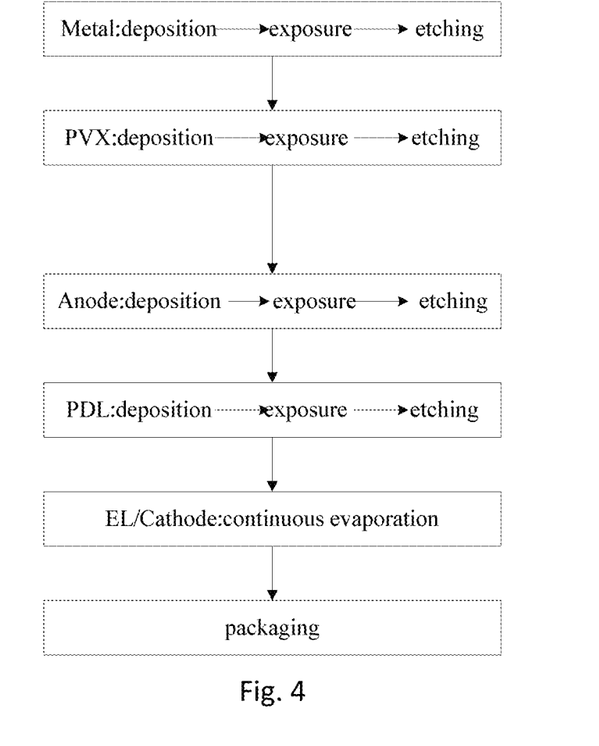
FIG. 4 is a flowchart illustrating the method for fabricating an OLED light source in the prior art.
Figure 5:
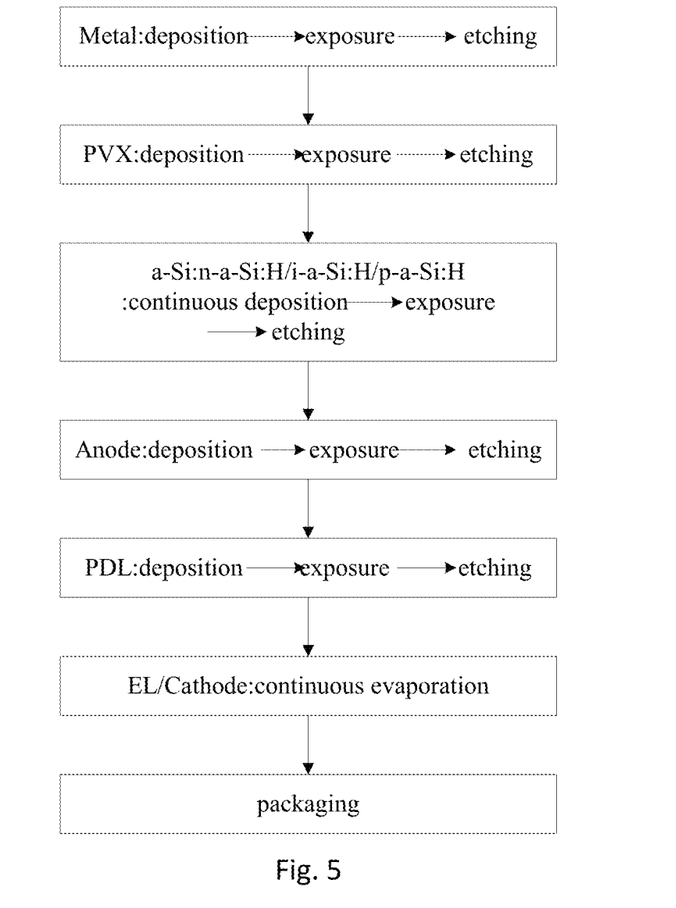
FIG. 5 is a flowchart illustrating a method for fabricating an OLED light source according to an embodiment of the present disclosure.

Referring to FIG. 4, it is a flowchart illustrating the method for fabricating an OLED light source in the prior art; and FIG. 5 is a flowchart illustrating a method for fabricating an OLED light source according to an embodiment of the present disclosure. Compared with FIGS. 4 and 5, it can be seen that the present disclosure adds a process flow on the basis of the process flow of the related OLED light source, and all of other process flows are compatible with the related processes, such that the cost can be minimized. The added process flow is that the three layers of n-a-Si:H, i-a-Si:H and p-a-Si:H are continuously deposited, and then the desired pattern is formed by exposing and etching. The n-a-Si:H, i-a-Si:H and p-a-Si:H are active layers in the photosensitive sensor.

Specifically, referring to the structures shown in FIGS. 1-6, the method for fabricating the OLED light source includes the following steps.

Forming light emitting units which include anodes arranged in an array.

Forming metal wires for connecting the anodes, which are disposed between the light emitting units.

Forming a photosensitive sensor disposed on the metal wires, the metal wires being as a sense electrode of the photosensitive sensor.

Forming a drive electrode provided on the photosensitive sensor.

Forming an opening disposed at a position where the metal wires correspond to the drive electrode.

Wherein the photosensitive sensor is configured to receive an external light signal through the opening.

In some exemplary embodiments of the present disclosure, the method may further include the following steps.

Metal wires 2 with a grid-like structure are formed on a substrate 1 and an opening disposed at a predetermined position of the metal wires 2.

A passivation layer 3 is formed on the metal wires 2.

An active layer 4 of a photosensitive sensor on the passivation layer 3.

An anode layer pattern 5 and a drive electrode 7 are formed on the active layer 4 of the photosensitive sensor and the anode layer 5 is connected to the metal wires 2 through a via 51, the drive electrode 7 is above an opening of the metal wires 2.

A pixel definition layer 6 is formed above the anode layer 5 and the drive electrode 7.

An electroluminescent layer 8 and a cathode layer 9 are formed on the pixel definition layer 6.

A packaging layer is formed on the cathode layer. The metal wires 2, the passivation layer 3, the active layer 4, the anode layer 5 and the pixel definition layer 6 are generally realized by deposition, exposure and etching. The electroluminescent layer 8 and the cathode layer 9 are generally fabricated by continuous evaporation.

In some exemplary embodiments, the procedure for forming an active layer of a sensor by deposition, exposure and etching includes:

continuous deposition of three layers of p-a-Si:H, i-a-Si:H and n-a-Si:H; and the active layer being formed with a desired pattern by exposure and etching.

In some exemplary embodiments, the anode layer and the drive electrode are simultaneously formed by a single patterning process.

Of course, only the common manufacturing process of the OLED is described herein, and the steps of the manufacturing process can be replaced or the different levels for the manufacturing process can be set accordingly, so long as the design in which the photosensitive sensor can be set in the OLED light source and the different structures existing in the OLED light source can be used as the two different sense electrodes can be realized.

Figure 6:
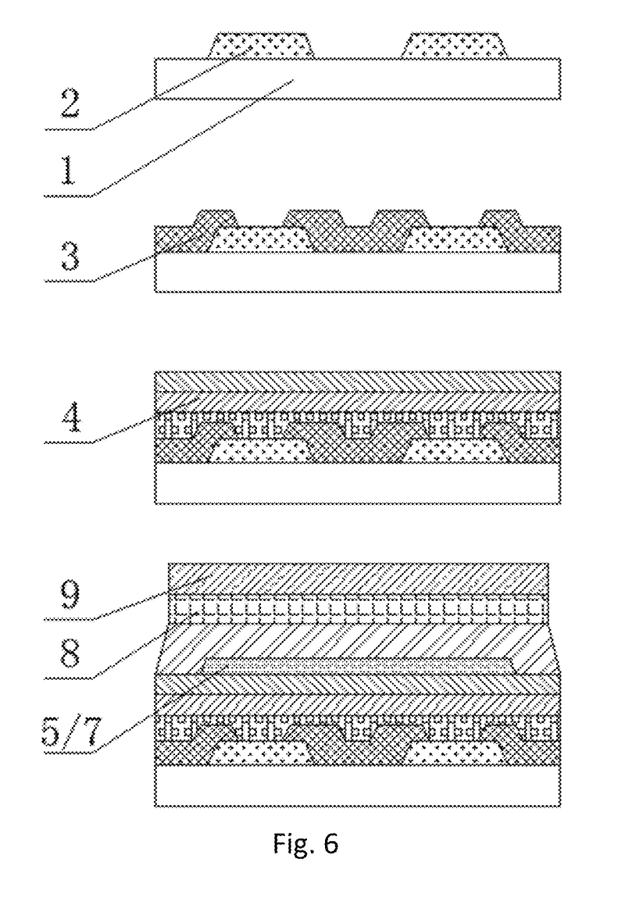
FIG. 6 is a schematic diagram illustrating details for procedure of a method for fabricating an OLED light source according to an embodiment of the preset disclosure.

Referring to FIG. 6, it is a schematic diagram illustrating details for procedure of a method for fabricating an OLED light source according to an embodiment of the preset disclosure. As can be seen from the figure, the present disclosure is fully compatible with existing OLED manufacturing processes and corresponding equipment, and at the meanwhile, it is easy to realize that a specific operation process of the photosensitive sensor is increased. In addition, according to FIG. 6, there may be one or more openings on the metal wires that are disposed evenly, and the size of the corresponding active layer 4 or the drive electrode 7 is significantly larger than that of the opening.

Figure 7:
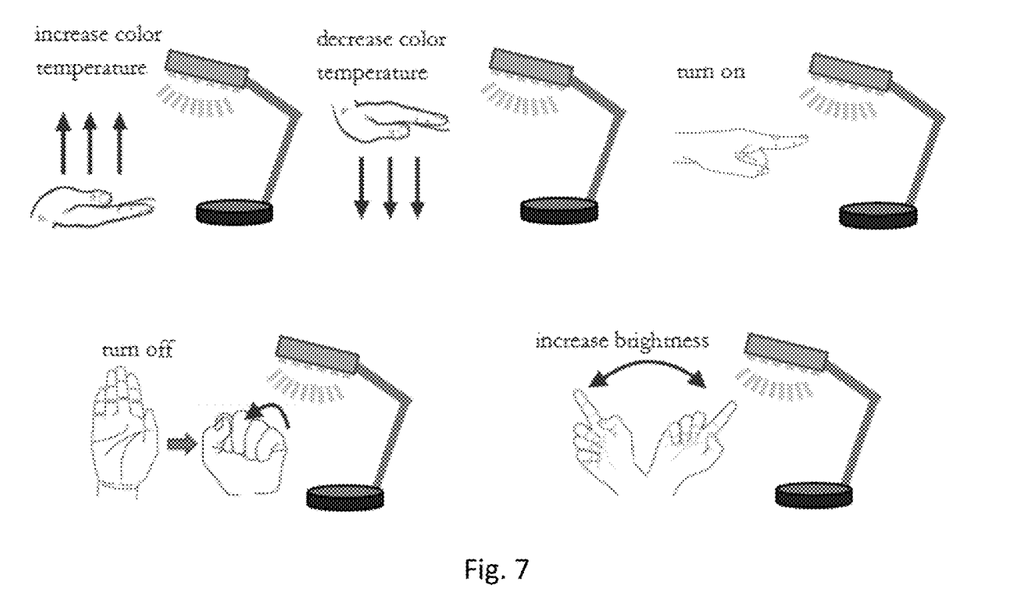
FIG. 7 is a schematic diagram illustrating the effect for gesture recognition of an OLED light source according to an embodiment of the present disclosure.

FIG. 7 is a schematic diagram illustrating the effect for gesture recognition of an OLED light source according to an embodiment of the present disclosure. Here, when the OLED is used as a light source for illumination, the user can realize remote sensing control or gesture recognition such as the light source switch, color temperature adjustment, and brightness adjustment by setting different gestures. Of course, it is need for gesture recognition that the circuits for controlling the corresponding photosensitive sensor and the corresponding algorithms must be designed, such that gesture changes can be recognized accordingly by the changes in the external optical signals sensed by the photosensitive sensors. In addition, based on the improvement of the corresponding technology, the OLED light source described in the present disclosure may also be applicable to screens of various smart devices, such as a screen of a mobile phone. Thus, it is possible for the OLED light source described in the present disclosure to implement gesture recognition on a screen of a smart device.

It should be understood for those skilled in the art that the discussion of any of the above embodiments is merely exemplary and is not intended to have the scope of the present disclosure, including the claims, be limited to these examples. Under the teachings of the present disclosure, the technical features in the above embodiments and different embodiments may also be combined and their steps may be implemented in an arbitrary sequence. There are many other variations for different aspects of the present disclosure as described above, which are not provided in detail for the sake of conciseness.

In addition, the well-known power/ground connections related to integrated circuit (IC) chips and other components may or may not be shown in the drawings provided for simplicity of illustration and discussion, and this can avoid the present disclosure to be obscured. Moreover, the devices may be shown in block diagram form to facilitate to understand the present disclosure, and these block diagrams also take into account the fact that the details regarding the implementation of these devices in the block diagrams are highly dependent on the platform on which the present disclosure is to be implemented (i.e., These details should be absolutely within the scope that those skilled in the art can understand. Where specific details (e.g., the circuitry) are set forth to describe example embodiments of the present disclosure, it will be apparent to those skilled in the art that the present disclosure can be implemented without these specific details or with some variations from these specific details. Therefore, these descriptions should be considered as being illustrative rather than being restrictive.

Although the present disclosure has been described in conjunction with specific embodiments thereof, many alternatives, modifications, and variations of these embodiments will be apparent to those skilled in the art in view of the foregoing description. For example, other memory architectures (e.g., dynamic RAM (DRAM)) may use the embodiments discussed.

The embodiments of the present disclosure are intended to embrace all such alternatives, modifications, and variations that fall within the broad scope of the appended claims. Therefore, any omissions, modifications, equivalent replacements, improvements or the like made within the spirit and principle of the present disclosure should be included in the protection scope of the present disclosure.

What is claimed is:

1. An OLED light source, comprising:
   light emitting units, comprising anodes arranged in an array;
   metal wires, connecting the anodes and disposed between the light emitting units;
   a photosensitive sensor, disposed on the metal wires, the metal wires being as a sense electrode of the photosensitive sensor;
   a drive electrode, provided on the photosensitive sensor; and
   an opening, disposed at a position where the metal wires correspond to the drive electrode,
   wherein the photosensitive sensor is configured to receive an external light signal through the opening.

2. The OLED light source according to claim 1, wherein the drive electrode and the anodes are arranged in a same layer and are spaced from each other.

3. The OLED light source according to claim 1, wherein an electroluminescent layer is above the anodes.

4. The OLED light source according to claim 1, wherein the drive electrode and the anodes are made of same material.

5. The OLED light source according to claim 1, wherein the metal wires disposed on a substrate have a grid-like structure; and the anodes are arranged in an array based on the grid-like structure and are connected to the metal wires through a via.

6. The OLED light source according to claim 1, wherein the photosensitive sensor has a PIN structure and the PIN structure comprises a semiconductor material as an active layer.

7. The OLED light source according to claim 6, the semiconductor material adopted by the PIN structure is p-a-Si:H, i-a-Si:H and n-a-Si:H; or
   p-ZnO, i-ZnO and n-ZnO; or
   p-IGZO, i-IGZO and n-IGZO; or
   p-GaN, i-GaN and n-GaN.

8. A display device, comprising an OLED light source, wherein the OLED light source comprises:
   light emitting units, comprising anodes arranged in an array;
   metal wires, connecting the anodes and disposed between the light emitting units;

a photosensitive sensor, disposed on the metal wires which makes the metal wires as a sense electrode of the photosensitive sensor;

a drive electrode, provided on the photosensitive sensor; and an opening, disposed at a position where the metal wires correspond to the drive electrode, wherein the photosensitive sensor is configured to receive an external light signal through the opening.

9. The display device according to claim 8, wherein the drive electrode and the anodes are arranged in a same layer and are spaced from each other.

10. The display device according to claim 8, wherein an electroluminescent layer is above the anodes.

11. The display device according to claim 8, wherein the drive electrode and the anodes are made of same material.

12. The display device according to claim 8, wherein the metal wires disposed on a substrate and has a grid-like structure; and the anodes are arranged in an array based on the grid-like structure and are connected to the metal wires through a via.

13. The display device according to claim 8, wherein the photosensitive sensor has a PIN structure and the PIN structure comprises a semiconductor material as an active layer.

14. The display device according to claim 13, the semiconductor material adopted by the PIN structure is p-a-Si:H, i-a-Si:H and n-a-Si:H; or p-ZnO, i-ZnO and n-ZnO; or p-IGZO, i-IGZO and n-IGZO; or p-GaN, i-GaN and n-GaN.

15. A method for fabricating an OLED light source, comprising:

forming light emitting units which comprise anodes arranged in an array;

forming metal wires connecting the anodes and disposed between the light emitting units;

forming a photosensitive sensor disposed on the metal wires, the metal wires being as a sense electrode of the photosensitive sensor;

forming a drive electrode provided on the photosensitive sensor; and forming an opening disposed at a position where the metal wires correspond to the drive electrode, wherein the photosensitive sensor is configured to receive an external light signal through the opening.

16. The method according to claim 15, wherein further comprising:

forming metal wires with a grid-like structure on a substrate and disposing an opening at a predetermined position of the metal wires;

forming a passivation layer on the metal wires;

forming an active layer of a photosensitive sensor on the passivation layer;

forming an anode layer pattern and a drive electrode on the active layer of the photosensitive sensor and the anode layer is connected to the metal wires through a via, the drive electrode being above an opening of the metal wires;

forming a pixel definition layer above the anode layer and the drive electrode;

forming an electroluminescent layer and a cathode layer on the pixel definition layer; and forming a packaging layer on the cathode layer.

17. The method according to claim 15, wherein the anode layer and the drive electrode are formed by a single patterning process, simultaneously.

* * * * *